United States Patent [19]
Jeddeloh

[11] Patent Number: 5,909,701
[45] Date of Patent: Jun. 1, 1999

[54] INTERFACE FOR HIGH SPEED MEMORY

[75] Inventor: Joe M. Jeddeloh, Minneapolis, Minn.

[73] Assignee: Micron Electronics, Nampa, Id.

[21] Appl. No.: 08/896,668

[22] Filed: Jul. 18, 1997

Related U.S. Application Data

[62] Division of application No. 08/820,595, Mar. 19, 1997.

[51] Int. Cl.⁶ .................................................. G06F 12/00
[52] U.S. Cl. ..................... 711/167; 711/168; 711/169; 365/194; 365/193
[58] Field of Search ............................... 365/233, 189.05, 365/230.03, 189.01, 230.01, 230.02; 711/167, 168, 169

[56] References Cited

U.S. PATENT DOCUMENTS

| | | | |
|---|---|---|---|
| 5,034,981 | 7/1991 | Leonard et al. | 380/5 |
| 5,146,573 | 9/1992 | Sato et al. | 711/206 |
| 5,479,646 | 12/1995 | Proebsting | 711/167 |
| 5,692,165 | 11/1997 | Jeddeloh et al. | 395/551 |
| 5,721,859 | 2/1998 | Manning | 365/189.05 |

OTHER PUBLICATIONS

"PT86C521 V1–LS Pentium Processor PCI System Controller," *Preliminary Data Book v0.7*, Pico Power, Sep. 1995, pp. 1–45 through 1–67.

"Vesuvius–LS," *Preliminary Data Book v0.7*, Pico Power, Sep. 1995, pp. i–xiv.
Burst EDO DRAMs Comparative Description and System Design Guide, Micron Technology, Inc., 1995, pp. 1–27.
Burst EDO DRAM Information Data Sheets and Technical Notes, Micron Technology, Inc., 1995, pp. 1–14.

*Primary Examiner*—John W. Cabeca
*Assistant Examiner*—Mehdi Namazi
*Attorney, Agent, or Firm*—Seed & Berry LLP

[57] ABSTRACT

An interface circuit, which can form part of a memory device or a memory controller, includes a read circuit, a write circuit, and a clocking circuit. The read circuit includes two registers or latches that receive alternate data read from burst EDO or synchronous memory. A multiplexer and read output register provide the data to a CPU or other application. If the memory is burst EDO, then the clocking circuit receives the system clock signal and generates a $\overline{CAS}$ signal based on positive or negative going edges of the clock signal, depending upon delays inherent in the system in which the present invention is employed. The $\overline{CAS}$ signal is then used to drive the two read latches. If the memory is synchronous memory, then the clock circuit includes an inverter that inverts the clock signal, and provides the inverted clock signal to the synchronous memory. The inverted clock signal is delayed and then used to drive the two read registers. A write register in the write circuit is driven based on the system clock, and therefore operates separately from the read circuit.

25 Claims, 13 Drawing Sheets

INTERFACE FOR HIGH SPEED MEMORY

CROSS-REFERENCE TO RELATED APPLICATION

This application is a division of U.S. patent application Ser. No. 08/820,595, filed Mar. 19, 1997, now pending.

TECHNICAL FIELD

The present invention relates to memory interface circuits and methods, and more particularly, to memory interfaces for high speed memory such as burst EDO and synchronous memory devices.

BACKGROUND OF THE INVENTION

Various applications, such as computer systems, rely on memory devices to store instructions and data that are processed by a microprocessor or CPU. In a typical computer system, the CPU communicates with the memory devices via a CPU bus and a memory controller. The memory devices typically include a dynamic random access memory (DRAM) packaged as a module, such as a single in-line memory module (SIMM) or a dual in-line memory module (DIMM). The memory module typically includes one or more banks of memory chips connected in parallel such that each memory bank stores one set of data, such as a word or double word, per memory address.

The memory controller communicates with, and interprets commands from, the CPU. For example, the CPU issues a command and an address which are received and translated by the memory controller. The memory controller, in turn, applies appropriate command signals and row and column addresses to the memory device. Examples of such commands include a row address strobe ($\overline{RAS}$), column address strobe ($\overline{CAS}$), write enable ($\overline{WE}$), and possibly a clock signal (CLK). (The line or bar over the acronym for a symbol generally indicates that the active state for the particular signal is a logical low value.) In response to the commands and addresses, data is transferred between the CPU and the memory device.

The speed of memory devices has not been able to keep pace with the speed advances in current CPUs. As a result, the speed of current computer systems is limited by the speed in which data and instructions can be accessed from the memory devices of the computer system.

To attempt to keep pace with speed advances in CPUs, faster memory devices have been developed, such as fast page mode (FPM) DRAMs. In most DRAM devices, to limit their size, each memory chip typically includes only enough address terminals to specify either the row address or the column address but not both simultaneously. As a result, the typical memory controller accesses a memory location sequentially by first transmitting the row address and then transmitting the column address. Specifically, the memory controller provides the row address to the memory device, asserts the $\overline{RAS}$ control signal, then provides the column address on the memory device and asserts the $\overline{CAS}$ control signal. To ensure proper timing, the memory controller provides a brief delay after asserting the $\overline{RAS}$ control signal and before asserting the $\overline{CAS}$ signal ($\overline{RAS}/\overline{CAS}$ delay).

The FPM DRAM eliminates the $\overline{RAS}/\overline{CAS}$ delay when successive accesses to the same row of memory occur. Because the majority of program execution is sequential in nature, program execution very often proceeds along a row of memory. When in page mode, the memory controller compares the row address of the memory location currently being accessed with the row address for the next memory access. If the row addresses are the same (known as a "page hit"), then the memory controller continues asserting the RAS control signal at the end of a current bus cycle. Because the memory already has the correct row address, the new column address can be immediately transferred to the memory without requiring a $\overline{RAS}/\overline{CAS}$ delay.

Extended data out (EDO) DRAMs improve upon the FPM DRAMs. In FPM DRAMs, the $\overline{CAS}$ high-to-low transition latches the column ddress, while the $\overline{CAS}$ low-to-high transition turns off an output buffer of the RAM. EDO DRAMs instead separate the two functions of the $\overline{CAS}$ signal. The low-to-high transition of $\overline{CAS}$ no longer turns off the output buffer. This change provides an extended time during which the output data is valid, hence the "extended data out" name. EDO memory allows the CPU tp sample the output data even while an address for a subsequent data transfer operation is being set up for the next read cycle.

Burst EDO (BEDO) DRAMs improve upon the good idea used in EDO DRAMs (leaving data valid even after $\overline{CAS}$ goes high). Most current CPUs typically access BEDO DRAMs in four-cycle bursts at four adjacent memory locations to fill a cache memory. Recognizing this typical access operation, BEDO DRAMs quickly provide the following three addresses itself after receiving the first address. BEDO DRAMs typically include a two-bit counter which provides three column addresses after the first received column address. The memory controller, and CPU, thus avoid the tight timing requirements of providing multiple addresses at appropriate times to the DRAM device. As a result, a "dead" time occurring between the appearance of each bit, byte, word, set or "group" of valid data at the output pins of the BEDO DRAM device is reduced, as compared with respect to EDO and FPM DRAMs. For example, where an FPM DRAM requires an initial five clock cycles to provide a first data group, and three clock cycles for each of three subsequent data groups (i.e., "5-3-3-3 bursting"), BEDO DRAMs can provide bursting at rates of up to 5-1-1-1 or less.

An even faster form of DRAM is synchronous DRAM (SDRAM). FPM, EDO, and BEDO DRAM are asynchronous DRAM devices because they do not require a clock input signal. The memory controller for asynchronous devices receives the system clock signal and operates as a synchronous interface with the CPU so that data is exchanged with the CPU at appropriate edges of the clock signal. Memory controllers for SDRAM devices are necessarily simpler because the SDRAM devices and the CPU both operate based on a clock signal. To achieve optimum performance with a CPU, the SDRAM device must be synchronized with the CPU.

As the speed of DRAM devices increase, other bottlenecks within computer systems arise. For example, as DRAM devices are operated at faster clock rates, the memory controllers to which they are coupled often cannot exchange data between the CPU and the memory device quickly enough.

Additionally, both BEDO DRAM and SDRAM devices require comparatively strict timing requirements compared to FPM and EDO DRAM devices. The strict timing requirements of BEDO DRAM requires a strict relation between generating an edge of $\overline{CAS}$ and when data is valid for reading or writing to the memory device. During each read cycle, $\overline{CAS}$ must fall during the middle of the period when data is to be read from the BEDO DRAM. For example, there is very little room for time delay or skew between the system clock and the $\overline{CAS}$ control signal supplied to the BEDO DRAM when the BEDO DRAM is operated in the 5-1-1-1 burst mode.

As a result, designers must design their computer systems, or other applications, with minimum trace lengths on circuit boards to reduce propagation delays, and employ other methods to minimize skew between the system clock and command signals based on the clock. One memory controller chip set by Intel is believed to accommodate BEDO DRAM; however, such a chip set likely still requires the designer to be subject to the strict timing requirements of BEDO memory. Similarly, SDRAM devices require strict timing of data transfers with the SDRAM device in relation to the system clock signal. As a result of such strict requirements of BEDO DRAM and SDRAM devices, computer system designers and other users of DRAM devices have difficulty implementing such higher speed DRAM devices into their applications, despite the increased performance of such devices. As a result, system designers have accepted and employed lower speed DRAM devices in exchange for looser timing requirements in their designs, despite the speed and other benefits of BEDO and SDRAM devices.

SUMMARY OF THE INVENTION

The slow acceptance of BEDO memory devices is partially due to the strict timing requirements needed to run the devices in 1,1,1 burst mode. There is very little room for skew between the system clock and the $\overline{CAS}$ control signal. The read and write requirements for the devices are also at odds with each other. For synchronous ("Sync") DRAM devices, performance is limited by clock skew within the system as seen by the memory devices and the memory controller. Once again, read and write requirements are conflicting.

Embodiments of the present invention provide a simple, robust method for a memory controller device or other device to interface to BEDO or Sync DRAM memory. Separate read and write control is provided. For a BEDO device read cycle, an embodiment of the present invention applies a programmable delay to a copy of the $\overline{CAS}$ signal as seen by the BEDO device, which is used to control two or more read latches. The read latches are then multiplexed, in alternating fashion, to a read register, and clocked by the system clock. This allows for a 2 clock crossing between the clock that produced the $\overline{CAS}$ signal and the register that clocks read data. This method provides plenty of margin for bursted reads.

BEDO writes, on the other hand, have different setup and hold requirements. An embodiment of the present invention creates a $\overline{CAS}$ signal delayed from the clock used to send write data. The $\overline{CAS}$ signal is delayed to center the falling edge with valid write data. Data is sent to the BEDO device from a register clocked by the positive edge system clock. This allows data to arrive before the falling edge of the $\overline{CAS}$ signal and provides the necessary write data hold time. The edge that the $\overline{CAS}$ signal produced is programmable via a configuration register.

For a Sync DRAM read, the clock as seen by the memory device is delayed by a programmable delay under an embodiment of the present invention. This delay will account for memory output, board crossing and memory controller input delays. The delay will be configured by the system BIOS for a given board or system implementation. Sync DRAM writes are strobed by the negative edge of the clock that produced the Sync DRAM control and data under an embodiment of the present invention. The negative edge of the clock is aligned at the center of valid write data. In all cases, a programmable delay can be inserted to provide a flexible method for controlling read and write data.

In sum, the present invention is directed to an interface circuit and method, which can form part of a computer system, memory device, memory controller, etc. The interface circuit may include a read circuit, a write circuit and a clocking circuit. The read circuit may include two storage devices that alternatively receive data read from high speed memories such as BEDO and SDRAM devices. In an exemplary embodiment, a multiplexer and read output register provide the read data to a CPU or other application. If the memory is burst EDO, then the clocking circuit in the exemplary embodiment receives the system clock signal and generates a $\overline{CAS}$ signal based on positive or negative going edges of the clock signal, depending upon delays inherent in the system in which the present invention is employed. The $\overline{CAS}$ signal is also used to drive the two storage devices. If the memory is SDRAM, then the clock circuit in an exemplary embodiment includes an inverter that inverts the clock signal, and provides the inverted clock signal to the SDRAM. The inverted clock signal is delayed and then used to drive the two storage devices. In the exemplary embodiment a write register in the write circuit is driven based on the system clock, and therefore operates separately from the read circuit, but which is synchronized with control of the memory device.

The apparatus of the present invention effectively forms an interface between a CPU and/or memory controller circuit and a semiconductor memory device. As noted above, the apparatus includes a clock circuit, a read circuit and an optional write circuit. The clock circuit is coupled to the CPU and the memory device. The clock circuit receives a timing signal and produces an interface clocking signal that is provided to the memory device. The read circuit is coupled to the memory device, the CPU and the clock circuit. The read circuit has first and second storage circuits that receive alternate data read from the memory device in response to portions of the interface clocking signal, and output the read data to the CPU. The write circuit is coupled to the memory device, the CPU and the clock circuit. The write circuit receives write data from the CPU and provides the write data to the memory device. The write circuit data is written to the memory device in response to the interface clocking signal.

DETAILED DESCRIPTION OF THE INVENTION

An interface circuit, and in particular, an interface circuit for use with high speed semiconductor memories such as BEDO or SDRAM, is described in detail herein. In the following description, numerous specific details are set forth such as timing and execution of commands to the memory devices, components within the interface circuit, etc., in order to provide a thorough understanding of the present invention. One skilled in the relevant art, however, will readily recognize that the present invention can be practiced without use of certain specific details described herein, or with other specific timing, components, etc. Well-known structures and operations are not shown or described in detail in order to avoid obscuring the present invention.

System Overview

Figure 1:
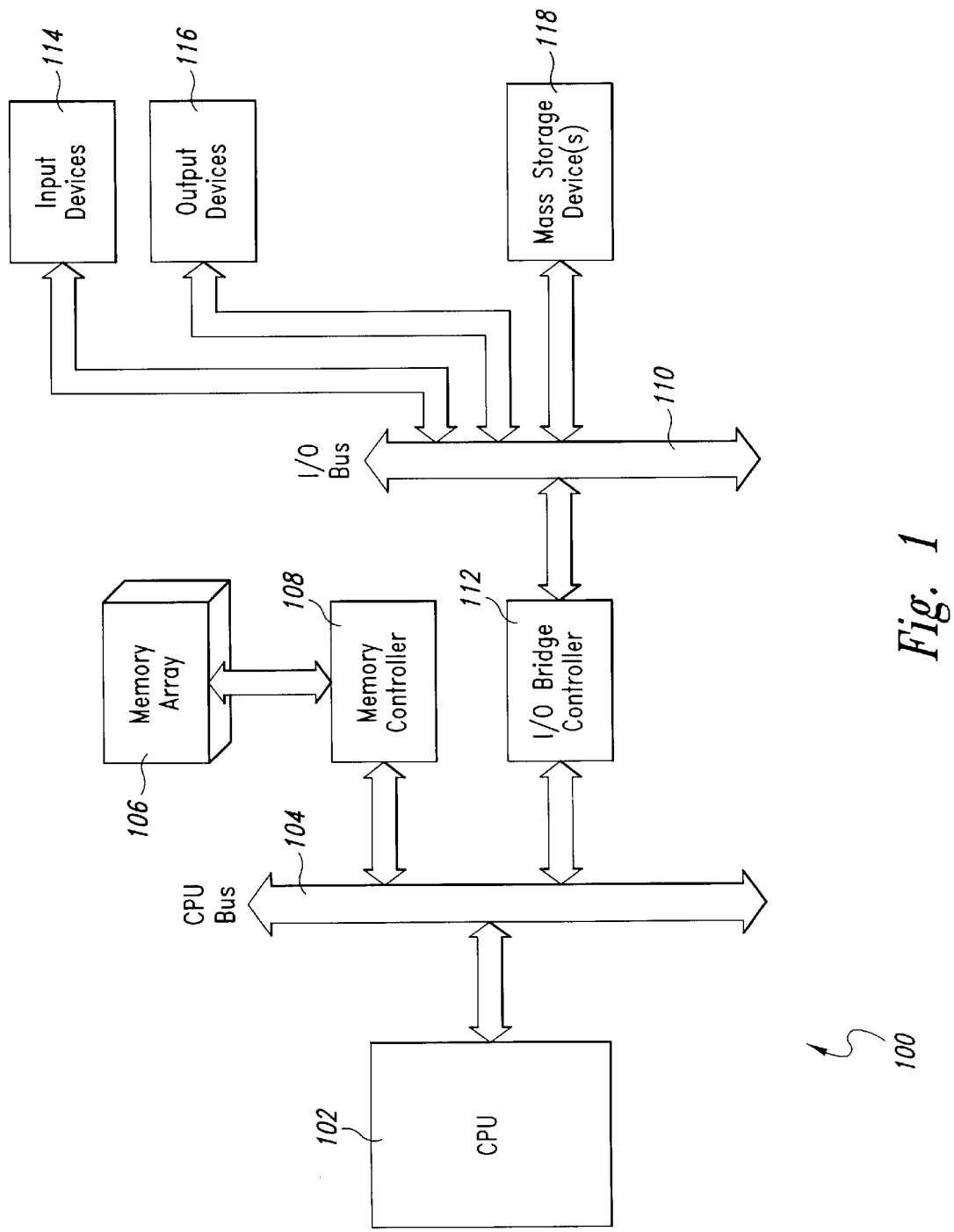
FIG. 1 is a block diagram of a computer system according to the present invention.

Referring to FIG. 1, a computer system 100, such as an IBM compatible personal computer ("PC") includes a CPU or central processing unit ("CPU") 102 coupled to a CPU bus 104. Examples of acceptable CPUs include Pentium®, Pentium® Pro, both manufactured by Intel Corporation, Alpha, manufactured by Digital Equipment Corporation, Power PC, manufactured by IBM, etc. A main memory array 106 is coupled to the CPU bus 104 through a memory controller 108. The memory array 106 can include SIMMs or DIMMs and may include any of various known BEDO DRAM and/or SDRAM devices, such as devices manufactured by Micron Technology, Inc. A system clock (not shown) provides a system clock signal to various components of the computer system 100, such as the CPU 102 and memory controller 108.

An input/output ("I/O") bus 110 is coupled to the CPU bus 104 through an I/O bridge controller 112. The I/O bridge controller 112 monitors bus traffic on the CPU and I/O buses 104 and 110, and routes data therebetween when it detects appropriate transfer commands on either of the buses. The I/O bridge controller 112 may also translate data between the buses, particularly when the CPU and I/O buses 104 and 110 have different widths and/or employ different formats, etc. One or more input devices 114, such as a keyboard, mouse, etc., may also be coupled to the I/O bus 110. Similarly, one or more output devices 116, such as visual display devices, printers, etc., may be coupled to the I/O bus 110. Furthermore, one or more mass storage devices 118, such as hard disk drives, CD-ROM drives, etc., may be coupled to the I/O bus 110.

Figure 2:
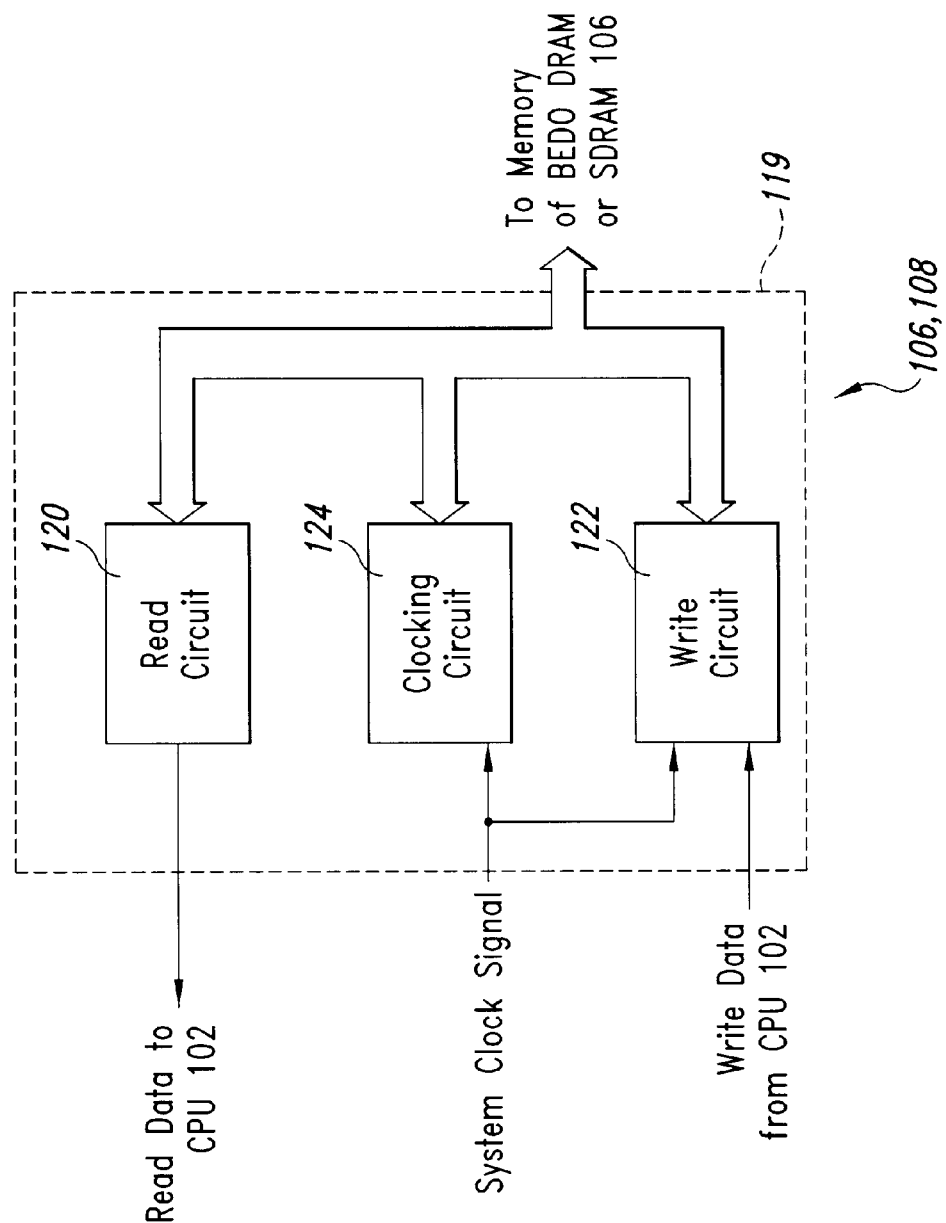
FIG. 2 is a block diagram of a memory interface of the computer system shown in FIG. 1.

Referring to FIG. 2, a block diagram of one embodiment of memory interface device 119 is shown. The memory interface 119 can be formed as a separate device, or be incorporated or integrated with the memory controller 108, or with one or more memory devices in the memory array 106.

The memory interface 119 includes a read circuit 120 that reads data from the memory array 106, and provides such read data to the CPU 102. Conversely, a write circuit 122 receives write data from the CPU 102 and provides the write data to the memory array 106. A clocking circuit 124 receives a clock signal such as the system clock signal noted above. In one embodiment, the read and clocking circuits 120 and 124 can be employed without the write circuit 122.

In general operation, the memory interface 119 of FIG. 2 receives a system clock signal from the memory controller 108, or alternatively directly from the system clock (not shown). The clocking circuit 124, in response to the system clock signal, produces an interface clocking signal. BEDO DRAM or SDRAM devices in the memory array 106 transfer data in response to the interface clocking signal. In the BEDO DRAM embodiment, described below, the clocking circuit 124 produces a $\overline{CAS}$ signal as the interface clocking signal in response to the system clock signal input thereto. In the SDRAM embodiment, described below, the clocking circuit 124 produces an inverted clock signal as the interface clocking signal in response to the system clock signal input thereto. Producing an interface clocking signal reduces skew between the system clock and control signals, as discussed below.

The read circuit 120 includes at least two storage circuits, as described below, that receive alternate read data from the memory array 106 in response to alternating portions of the interface clocking signal from the clocking circuit 124. By employing two storage circuits, such as two read latches, two registers, or a single register of width sufficient to store two data groups that are read separately therefrom, the read circuit 120 ensures that one read latch is always ready to receive read data while the other is outputting previously read data. The read circuit 120 can thus accommodate high speed memory in the memory array 106.

The write circuit 122, in one embodiment, includes a write data register that receives the write data from the CPU 102. The write data is clocked through the write register based on the clock signal. The write data, however, is written to the memory array 106 based not on the clock signal, but instead on the interface clocking signal. Such a difference between the clock signal and the interface clocking signal permits the interface circuit 119 to compensate for delays in the computer system 100, as described below.

Figure 3A:
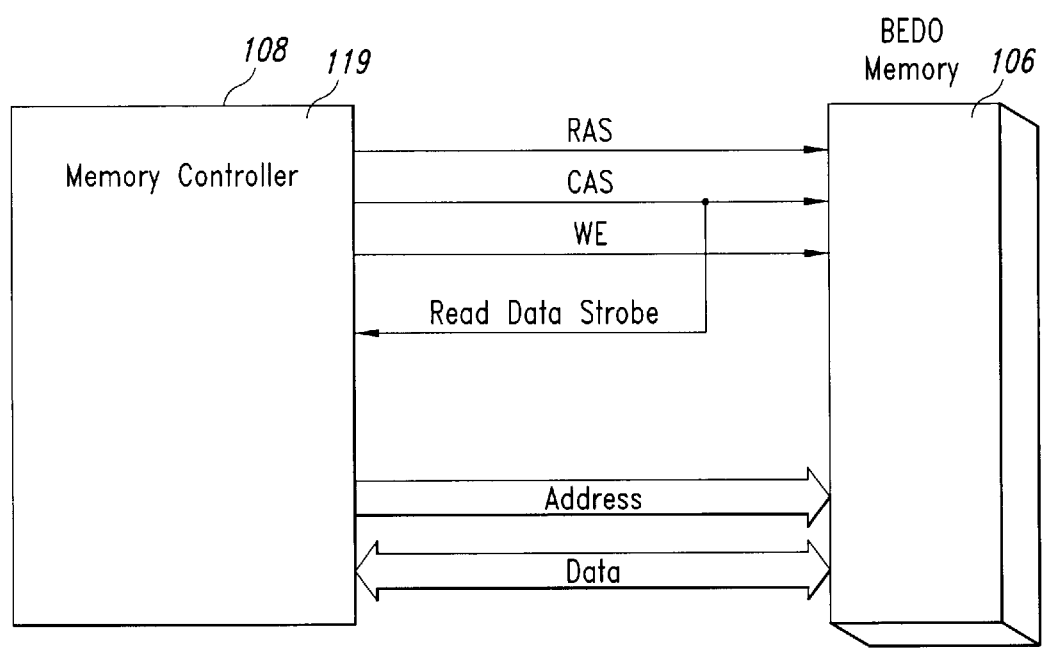
FIG. 3A is a block diagram of a memory controller and BEDO memory, and signals exchanged therebetween, under embodiments of the present invention.
Figure 3B:
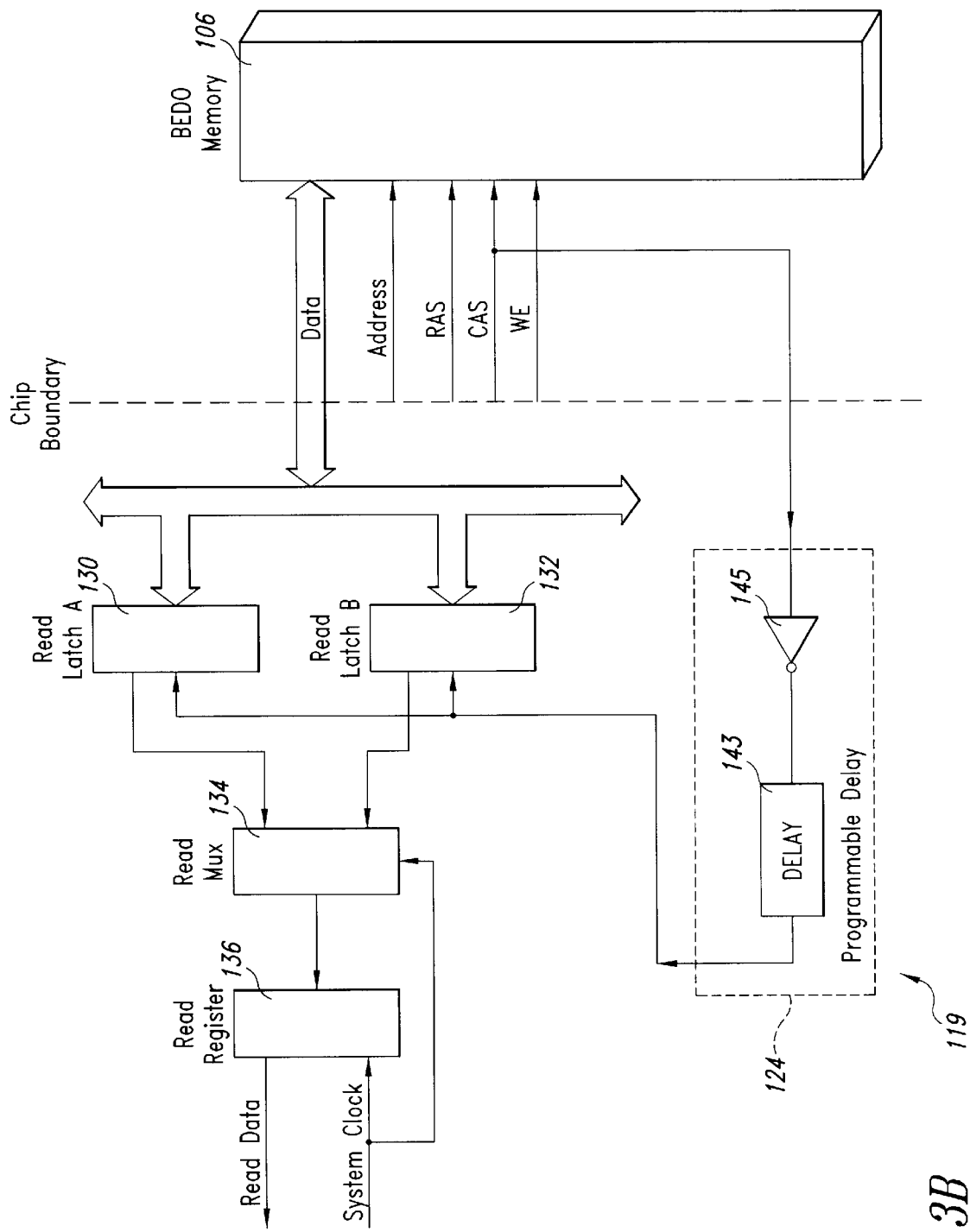
FIG. 3B is a block diagram of an exemplary embodiment of a read portion of the memory interface for use with BEDO DRAM devices.
Figure 3C:
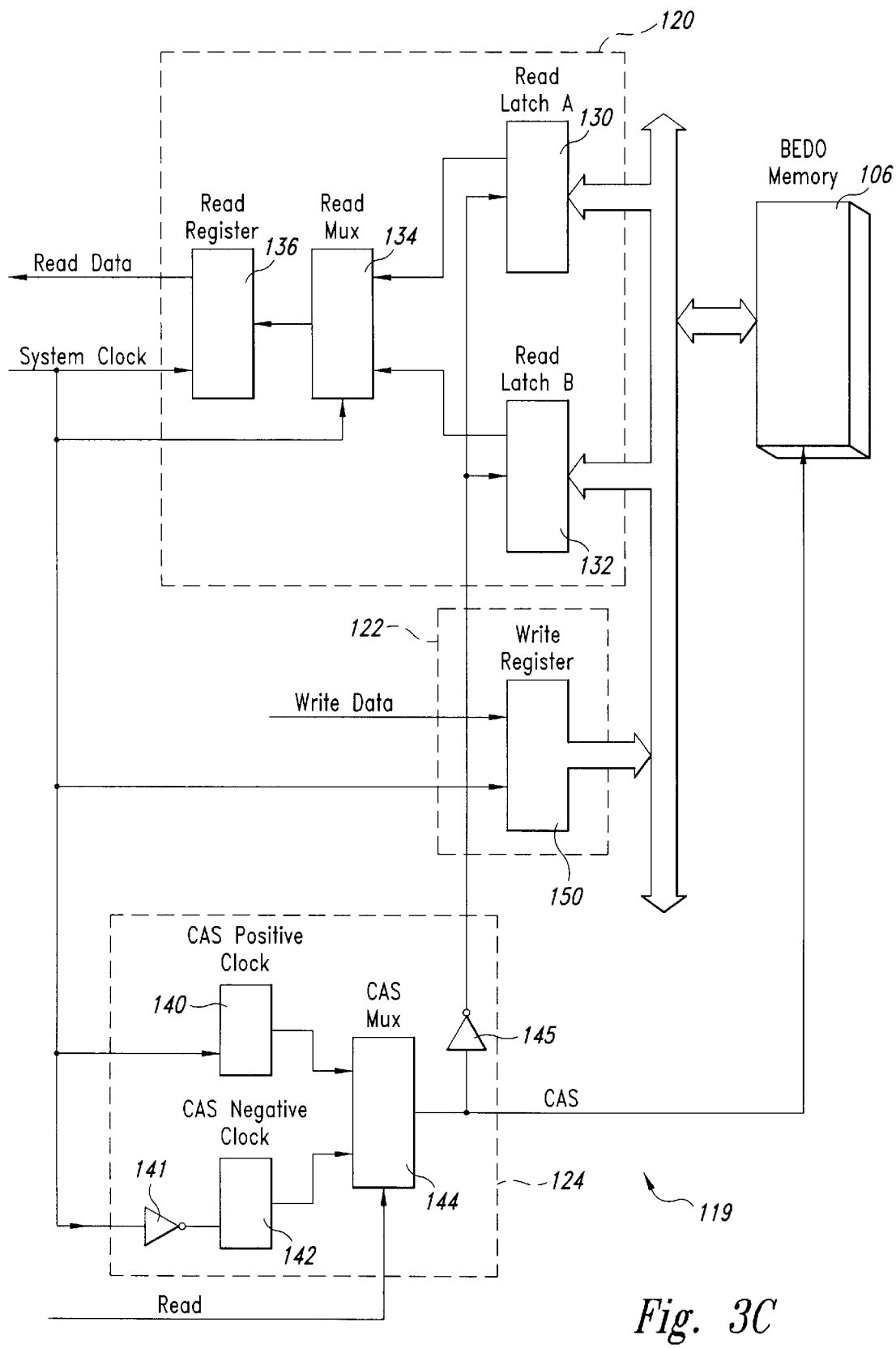
FIG. 3C is a block diagram of an exemplary, alternative embodiment of the memory interface of FIGS. 3B and 3D.

Referring to FIGS. 3A through 3C, one method of implementing the embodiment of FIG. 2 is shown for use with BEDO memory in the memory array 106. As shown in FIG. 3A, the memory controller 108 includes the interface circuit 119 and provides the $\overline{RAS}$, $\overline{CAS}$, $\overline{WE}$, and address signals to the BEDO memory in the memory array 106. As explained below, the $\overline{CAS}$ signal is also fed back to the memory controller 108 as a read data strobe.

BEDO Read and Clock Circuits

In considering first the read circuit 120, FIG. 3B shows first and second read latches 130 and 132 receive alternate read data from the BEDO memory in the memory array 106. As explained below, an inverted copy of the $\overline{CAS}$ signal, as compared with the $\overline{CAS}$ signal provided to the BEDO memory, is used to control the read latches 130 and 132 during each read cycle.

As noted above, prior memory devices, such as EDO DRAM, are capable of one read operation for every two cycles of $\overline{CAS}$. As a result, each data cycle would include a falling edge of $\overline{CAS}$ when data is valid at an output of the EDO DRAM. When attempting to operate a memory device twice as fast, such as BEDO DRAM operating at high clock speeds, timing of $\overline{CAS}$ with valid data is difficult. By employing the two read latches 130 and 132, each read latch operates at one-half speed, or every two $\overline{CAS}$ cycles. Combined, the two latches, however, operate at a full speed rate of valid data read out during each $\overline{CAS}$ cycle. As a result, the read circuit 120 provides for plenty of margin for time skew or delays in the system for bursted reads from the BEDO memory.

A read multiplexer 134 alternately receives the read data stored in the read latches 130 and 132. The read multiplexer 134 is controlled by a signal that is in sync with the bursted data input to the read latches 130 and 132, so that the appropriate data stored in one latch is passed through the multiplexer, while the other read latch is receiving read data from the BEDO memory. For example, the read multiplexer 134 can include a counter which is synched with the system clock signal used to increment the burst counter of the BEDO memory. A read register 136 receives the read data from the read multiplexer 134, and likewise outputs the read data in synchronism with the system clock signal.

The clocking circuit 124 may employ an inverter 145 which receives and inverts the $\overline{CAS}$ signal. A programmable delay element 143 may be utilized to delay the inverted $\overline{CAS}$ signal and provide such delayed signal to clock the read latches 130 and 132. The programmable delay element 143 provides a flexible method of controlling the output of data from the read latches 130 and 132. The amount of delay can be programmable by the user or by the BIOS instructions, depending upon loading or other delays in the computer system 100, as discussed herein.

Figure 3D:
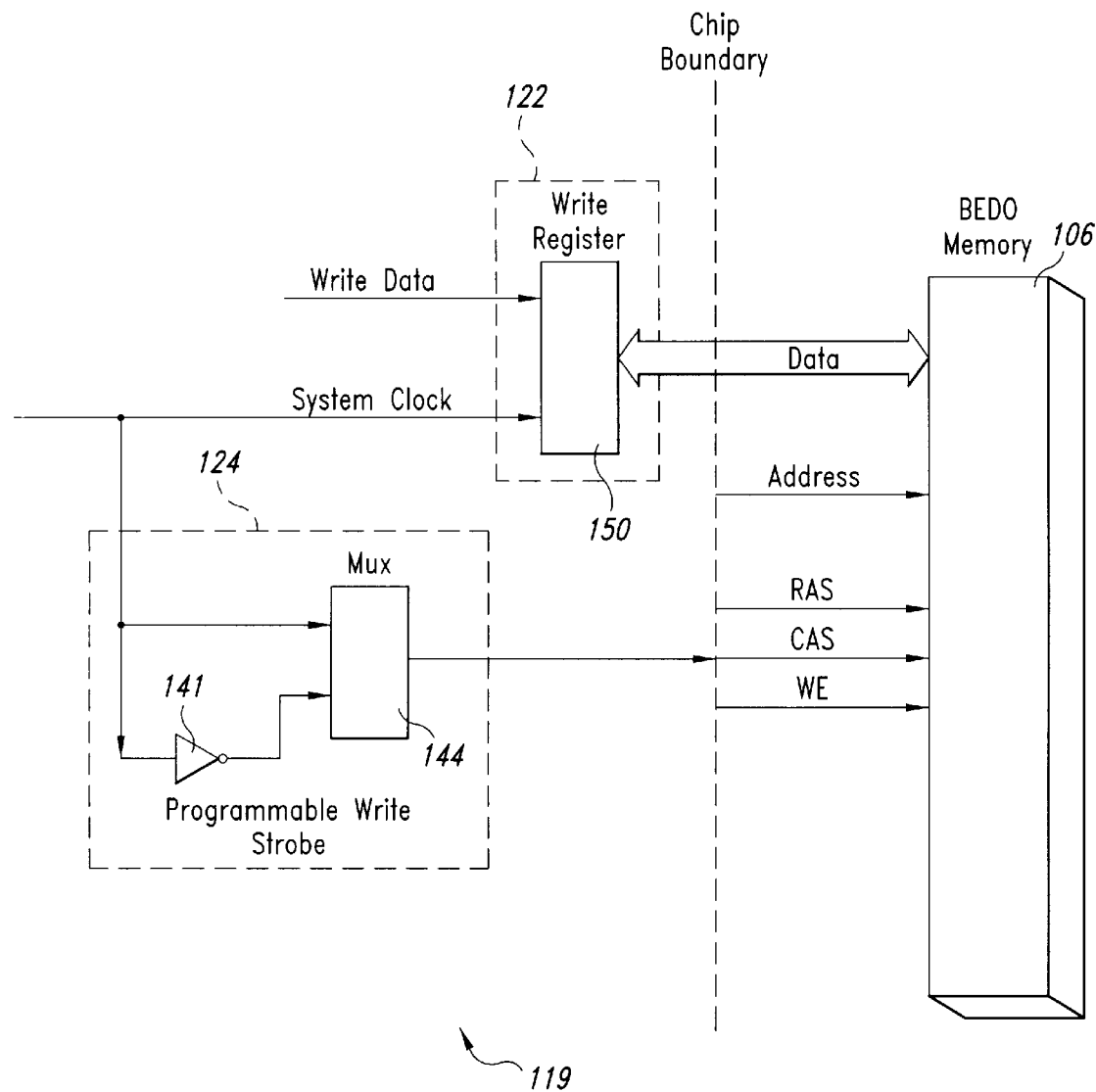
FIG. 3D is a block diagram of an exemplary embodiment of a rite portion of the memory interface for use with BEDO DRAM devices.

Referring to FIG. 3D, a first alternative embodiment of the interface circuit 119 is shown as an interface circuit 119'. This and other alternative embodiments are similar to the previously described embodiments, and all elements are similarly numbered when of similar construction. Only the significant differences in the construction or operation are discussed in detail.

The interface circuit 119' provides an alternative clocking circuit 124. As noted above, systems employing DRAM can include long trace lengths on a given circuit board. Long trace lengths provide increased capacitive loading. In order to handle such increased loads, or when multiple types of memory devices are employed in a given system, buffers can be provided, which are external to the memory devices. The interface circuit 119 may compensate for lightly loaded versus heavily loaded environments having short versus long delays, respectively. As a result, the clocking circuit 124 generates the $\overline{CAS}$ signal for controlling the BEDO DRAM in synchronism with edges of, based on, the system clock signal.

As shown in FIG. 3D, a $\overline{CAS}$ positive edge clock circuit 140 receives the system clock signal, while an inverter 141 inverts the system clock signal and inputs the inverted system clock signal to a $\overline{CAS}$ negative edge clock circuit 142. The $\overline{CAS}$ positive clock and $\overline{CAS}$ negative clock circuits 140 and 142 can include conventional programmable delay elements, pulse shaping circuits, or be omitted entirely, depending upon a given application for which the interface circuit 119 is adapted. A $\overline{CAS}$ multiplexer 144 selects one of the output signals from the $\overline{CAS}$ positive clock and $\overline{CAS}$ negative clock circuits 140 and 142, and selectively outputs portions of one of these signals as the $\overline{CAS}$ signal.

Figure 4:
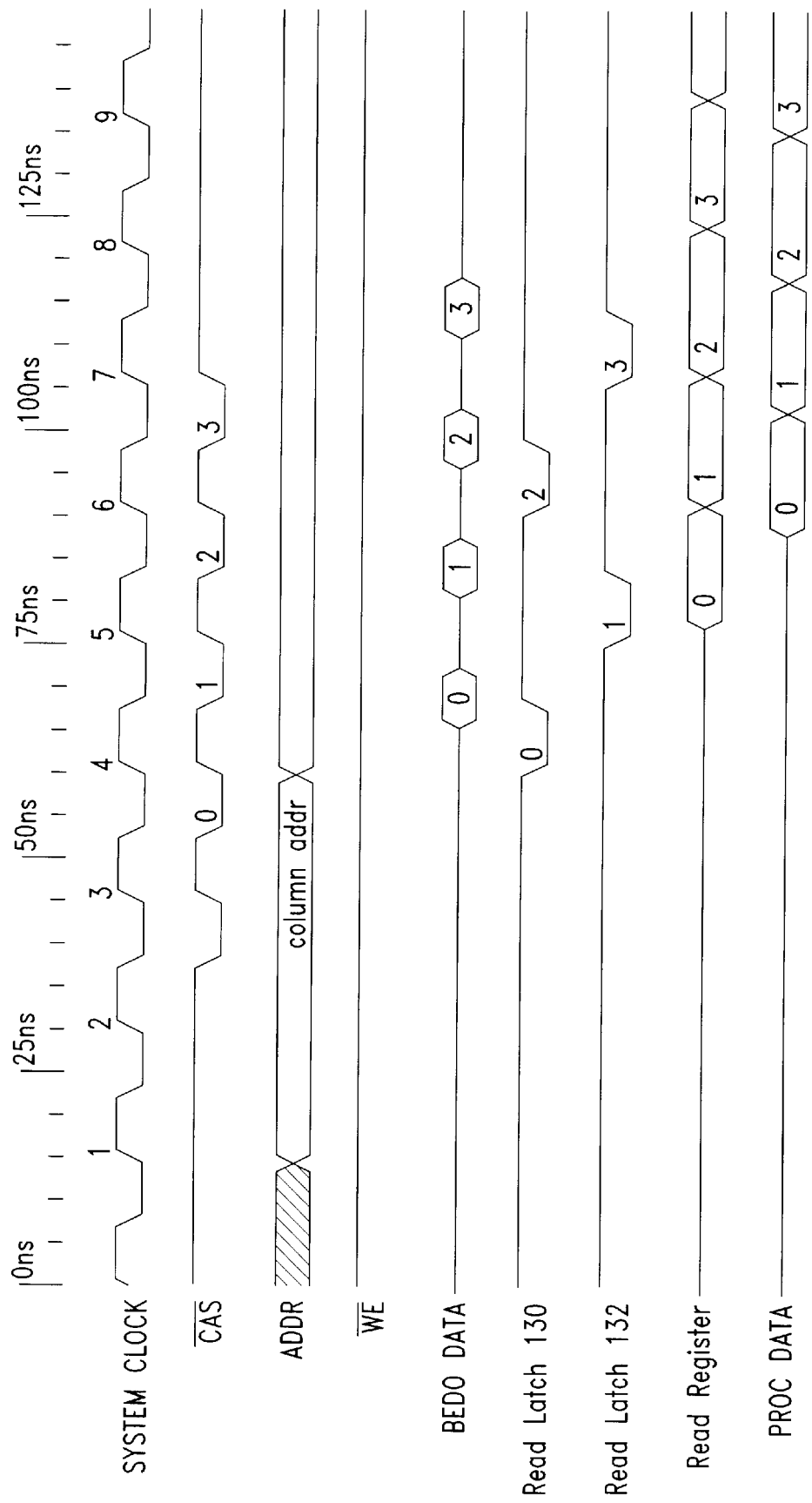
FIG. 4 is a timing diagram of a read operation performed by the memory interface and BEDO DRAM of FIG. 3.

A Read signal, provided by the memory controller 108 to the $\overline{CAS}$ multiplexer 144, selects a particular edge of the system clock for the $\overline{CAS}$ signal. For example, during a read operation, the Read signal applied to the $\overline{CAS}$ multiplexer 144 selects positive going edges of the system clock signal to produce positive edges of $\overline{CAS}$ cycles (as shown in FIG. 4). As explained below, during a write operation, however, the Read signal selects negative going edges of the system clock signal to produce the $\overline{CAS}$ signal, after a delay that includes the delay caused by the inverter 141 (as shown as a delay 1 in the $\overline{CAS}$ signal in FIG. 5). The $\overline{CAS}$ signal output from the $\overline{CAS}$ multiplexer 144 is provided to the BEDO memory of the memory array 106 to control conventional transfer of data to and from the memory.

As shown in FIG. 4, the inverted $\overline{CAS}$ signal is employed by the read latches 130 and 132 to produce appropriately timed Read Latch A and Read Latch B signals, respectively, for either memory controller 119 (FIG. 3B) or 119' (FIG. 3D). Referring to FIG. 4, an exemplary timing diagram of a read operation is shown. The timing diagram includes a system or CPU clock signal, the $\overline{CAS}$ signal, address signal ADDR, write enable signal $\overline{WE}$, data read from the BEDO memory (BEDO DATA), latch enable signals (Read Latch 130 and Read Latch 132), data output from the read register 136 (Read Register) and data provided to the CPU (PROC DATA).

The timing diagram of FIG. 4 is generally self-explanatory to those skilled in the relevant art, as is the operation of BEDO DRAM. As shown in FIG. 4, the $\overline{CAS}$ signal not only controls the reading of data from the BEDO memory under standard BEDO operation, but also controls the latching of the read data into the read latches 130 and 132. As a result, control of the read latches 130 and 132 are synchronized with the control of the BEDO memory, which thereby controls timing skew in the computer system 100.

As shown in FIG. 4 (and FIG. 5), the $\overline{CAS}$ signal is synchronized with the system clock signal. After the first cycle of $\overline{CAS}$, a first group of data (BEDO DATA 0) is read from the BEDO memory and latched into the first read latch 130 upon the first rising edge of the Read Latch 130 signal. Two clock cycles thereafter (and thus two $\overline{CAS}$ cycles thereafter) a third group of data (BEDO DATA 2) is read from the BEDO memory and latched into the first read latch 130 upon the next rising edge of the Read Latch 130 signal. The second read latch 132 receives and latches the second and fourth groups of read data one clock or $\overline{CAS}$ cycle after the first and third cycles under the Read Latch 132 signal.

BEDO Write Circuit

Referring back to FIGS. 3C and 3D, a write register 150 receives write data from the CPU 102 via the memory controller 108. The data is clocked out of the write register 150 in synchronism with the system clock signal which is input thereto.

As is known to those skilled in the art, write operations for BEDO memory require strict timing requirements. As shown in FIG. 3C, the clock circuit 124 of the memory controller 119 creates a $\overline{CAS}$ signal delayed from the system clock signal to control the sending of write data to the BEDO memory. The created $\overline{CAS}$ signal may be delayed by the clocking circuit 124 so that the falling edge of the signal is approximately centered with valid write data, as described herein, based on a positive edge of the system clock signal. As a result, and as described below, data arrives at the BEDO memory before the falling edge of the $\overline{CAS}$ signal, to thereby provide the necessary write data hold time. In general, by selecting between positive and negative going edges of the system clock signal to produce the $\overline{CAS}$ signal, the clocking circuit 124 produces an optimized $\overline{CAS}$ signal for the particular computer system 100 in which the BEDO memory is employed.

A programmable configuration register (not shown) in the memory controller 108 can be employed to determine whether the positive or negative going edges of the system clock signal are employed to initiate data transfer in the BEDO memory. Conventional memory controllers include configuration registers that are programmable by the basic input/output (BIOS) instructions of the computer system 100 whenever the computer system is initially energized. In some embodiments of the present invention, the BIOS instructions may program a configuration register in the memory controller 108 to provide one of two types of the Read signals. If the computer system is lightly loaded, then the memory controller 108 is programmed by the BIOS to provide a Read signal that instructs the $\overline{\text{CAS}}$ CAS multiplexer to pass the negative going edge of the system clock from the $\overline{\text{CAS}}$ negative clock circuit 142 as the positive going edge of each $\overline{\text{CAS}}$ cycle. Otherwise, if the computer system is heavily loaded, then the Read signal passes the positive going edge of the system clock from the $\overline{\text{CAS}}$ positive clock circuit 140 as the positive going edge of each $\overline{\text{CAS}}$ cycle. As explained below, by employing the positive going edge of the system clock, the write circuit 122 has sufficient time to write data to the BEDO memory in a heavily loaded system before the falling edge of $\overline{\text{CAS}}$, to thereby provide the necessary hold time. The configuration register can also identify BEDO memory in the memory array 106 if the memory array includes other types of memory devices having timing requirements which differ from the BEDO memory.

Figure 5:
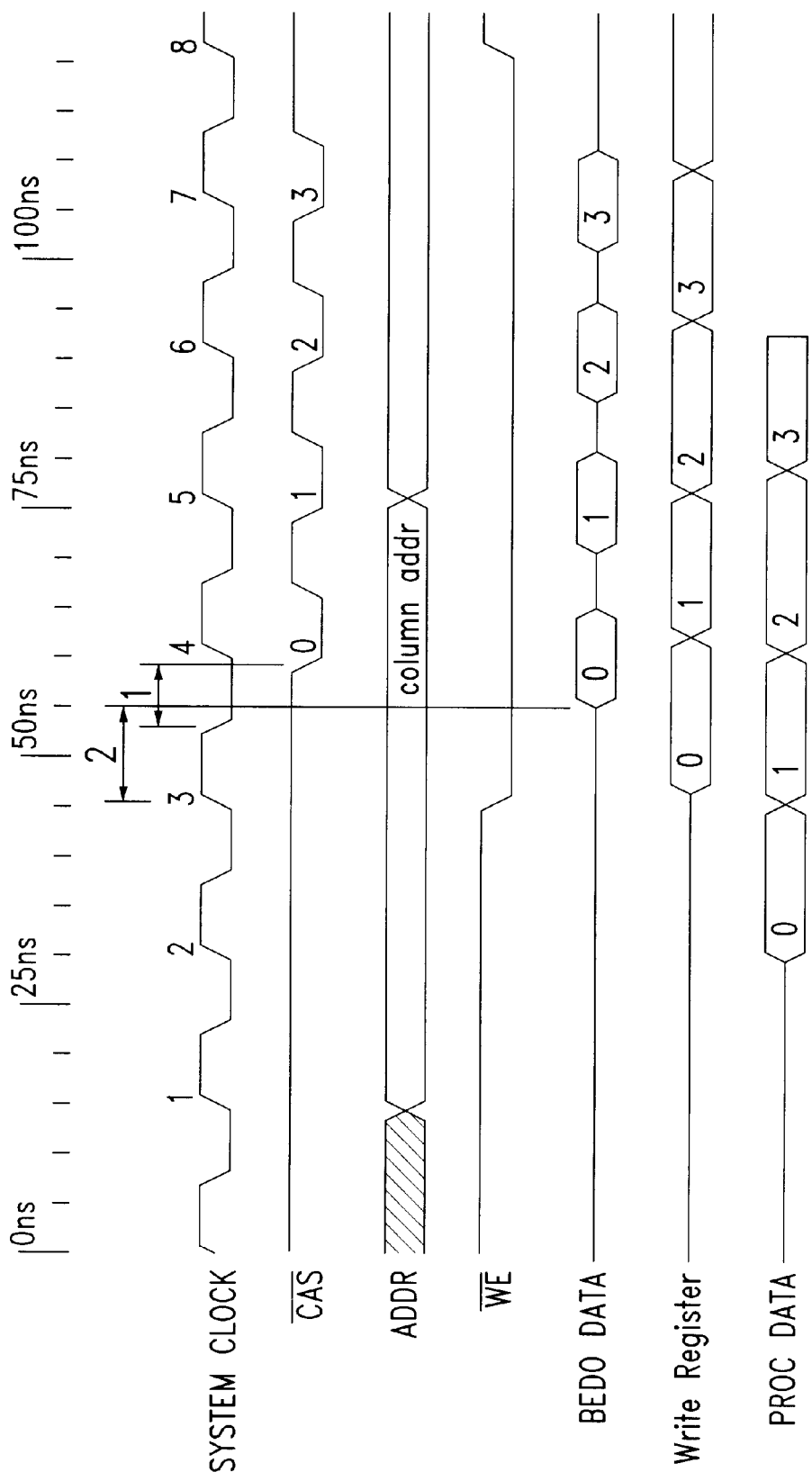
FIG. 5 is a timing diagram of a write operation performed by the memory interface and BEDO DRAM of FIG. 3.

The timing diagram of FIG. 5 shows an exemplary write operation. Again, the timing diagram of FIG. 5 is readily understood by those skilled in the relevant art. As is shown in FIG. 5, four groups of data from the CPU 102 are held in the write register 150 (Write Register 0 through 3 signal) long enough to coincide with each of four falling edges in the $\overline{\text{CAS}}$ signal so that the groups of data are written to the BEDO memory (BEDO DATA 0 through 3). The four groups of data from the CPU 102 (PROC DATA 0 through 3) are clocked into the write register 150 (Write Register 0 through 3) during each of one clock cycle after the data is provided from the CPU 102.

As shown in FIG. 5, the $\overline{\text{CAS}}$ signal is generated from the negative going clock pulses (from the $\overline{\text{CAS}}$ negative clock circuit 142), and thus the computer system 100 in the exemplary embodiment is lightly loaded. If, however, the computer system 100 were heavily loaded, the $\overline{\text{CAS}}$ signal would be based on the positive going edges of the system clock signal, and the $\overline{\text{CAS}}$ and BEDO data signals may be shifted rightward by approximately one-half of a clock pulse.

Figure 6A:
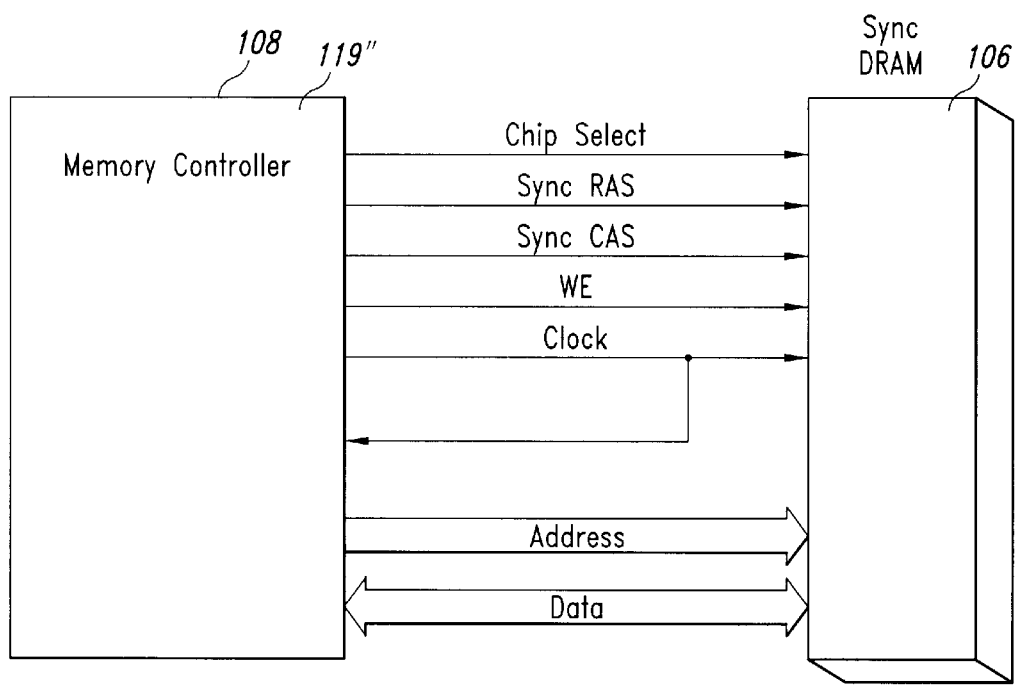
FIG. 6A is a block diagram of a memory controller and SDRAM memory, and signals exchanged therebetween, under embodiments of the present invention.
Figure 6B:
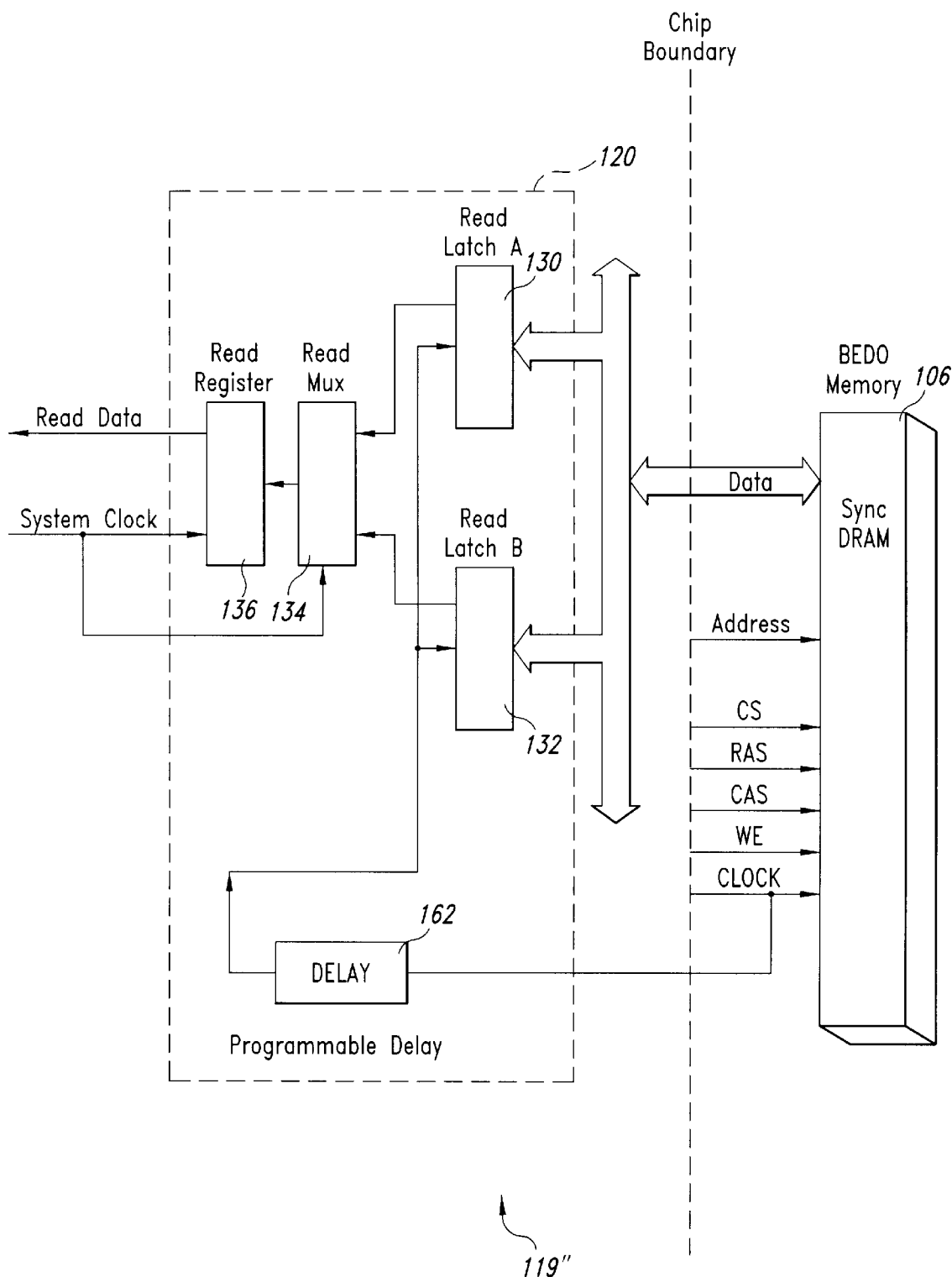
FIG. 6B is a block diagram of an exemplary embodiment of a read portion of the memory interface for use with SDRAM devices.
Figure 6C:
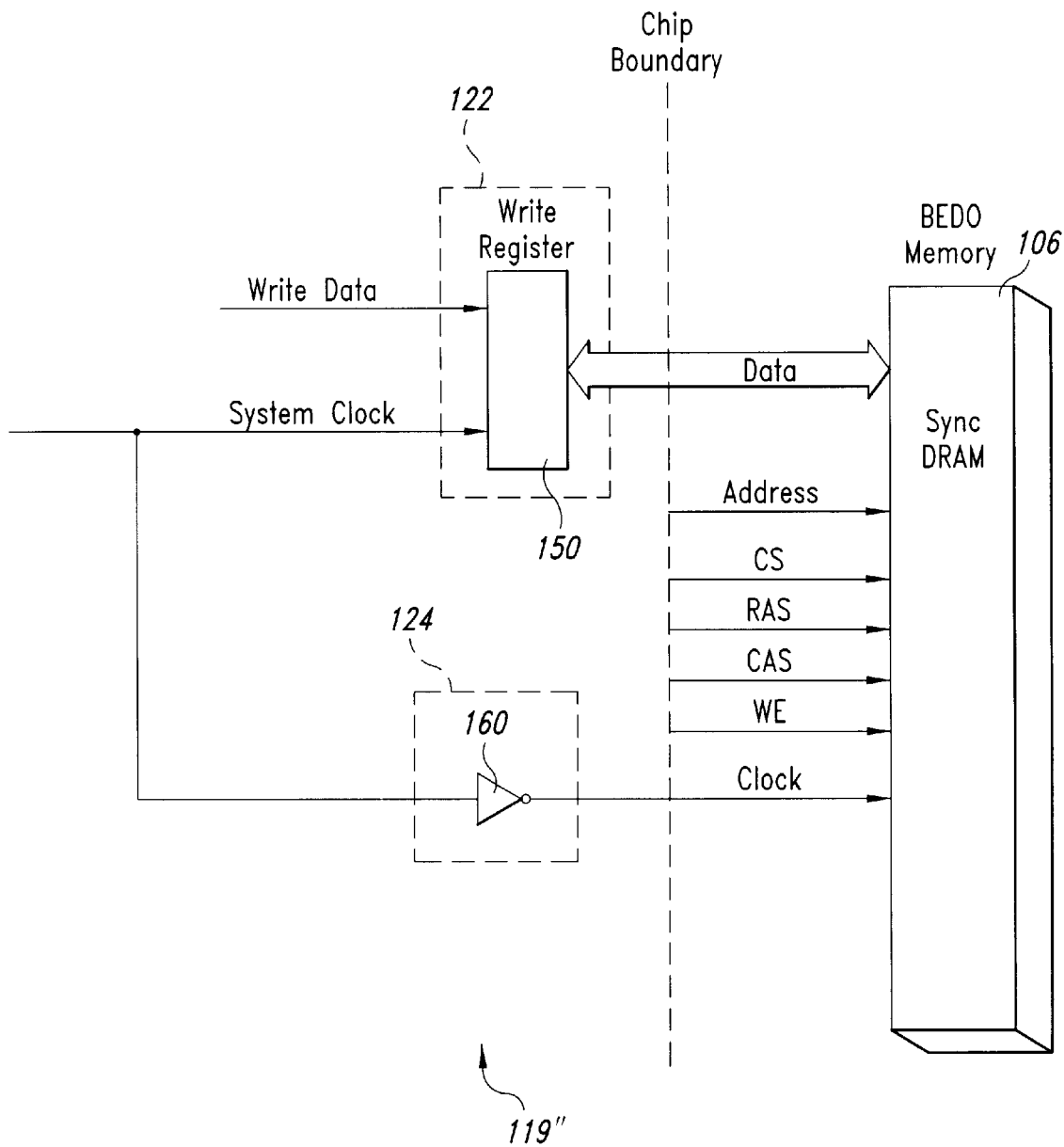
FIG. 6C is a block diagram of an exemplary embodiment of a write portion of the memory interface for use with SDRAM devices.

Referring to FIGS. 6A through 6C, a second alternative embodiment of the interface circuit 119 is shown as an interface circuit 119". As shown in FIG. 6A, the memory controller 108, containing the memory interface circuit 119", provides the chip select, sync $\overline{\text{RAS}}$, sync $\overline{\text{CAS}}$, $\overline{\text{WE}}$, clock and address signals to synchronous memory in the memory array 106. The interface circuit 119" may provide an interface for synchronous memory such as synchronous DRAM, graphics or video DRAM, as opposed to BEDO DRAM memory in the memory array 106.

SDRAM Read and Clock Circuits

Referring to FIG. 6C, the clock circuit 124 of the alternative interface circuit 119" may include an inverter 160 which inverts the system clock signal. The inverted system clock signal is then provided to, and controls operation of, the SDRAM memory in the memory array 106.

As with the first described interface circuit 119 for BEDO memory, the inverted clock signal also controls output of read data from the read circuit 120. Under the alternative interface circuit 119", the read latches 130 and 132 may be replaced by a pair of read registers (not shown). As is known, registers are similar to latches, but include an additional output latch. As a result, the inverted clock signal clocks out the data from the read registers to the read multiplexer 134.

A programmable delay element 162 may delay the inverted clock signal that is provided to the read latches 130 and 132 (or registers). The amount of delay is programmed by the user or the BIOS instructions, depending upon loading or other delays in the computer system 100. For example, the programmable delay element 162 may account for any trace delays or other motherboard effects in the computer system 100. The particular amount of delay may be programmed by the BIOS once the board configuration is determined (typically by the designer), so that the system clock signal is substantially aligned with the data valid window during a read. Typical delays can be between 1 and 4 nanoseconds.

Again, the inverted clock signal used to control the synchronous memory may also control, albeit delayed, the read latches 130 and 132. Such a feedback of the inverted clock signal compensates for the delay of buffering read data before being output from the synchronous memory, as well as the delay imposed by the read latches 130 and 132. The read data is output from the read output register 136 in synchronism with the system clock signal, which is a necessary feature of synchronous memory.

Figure 7:
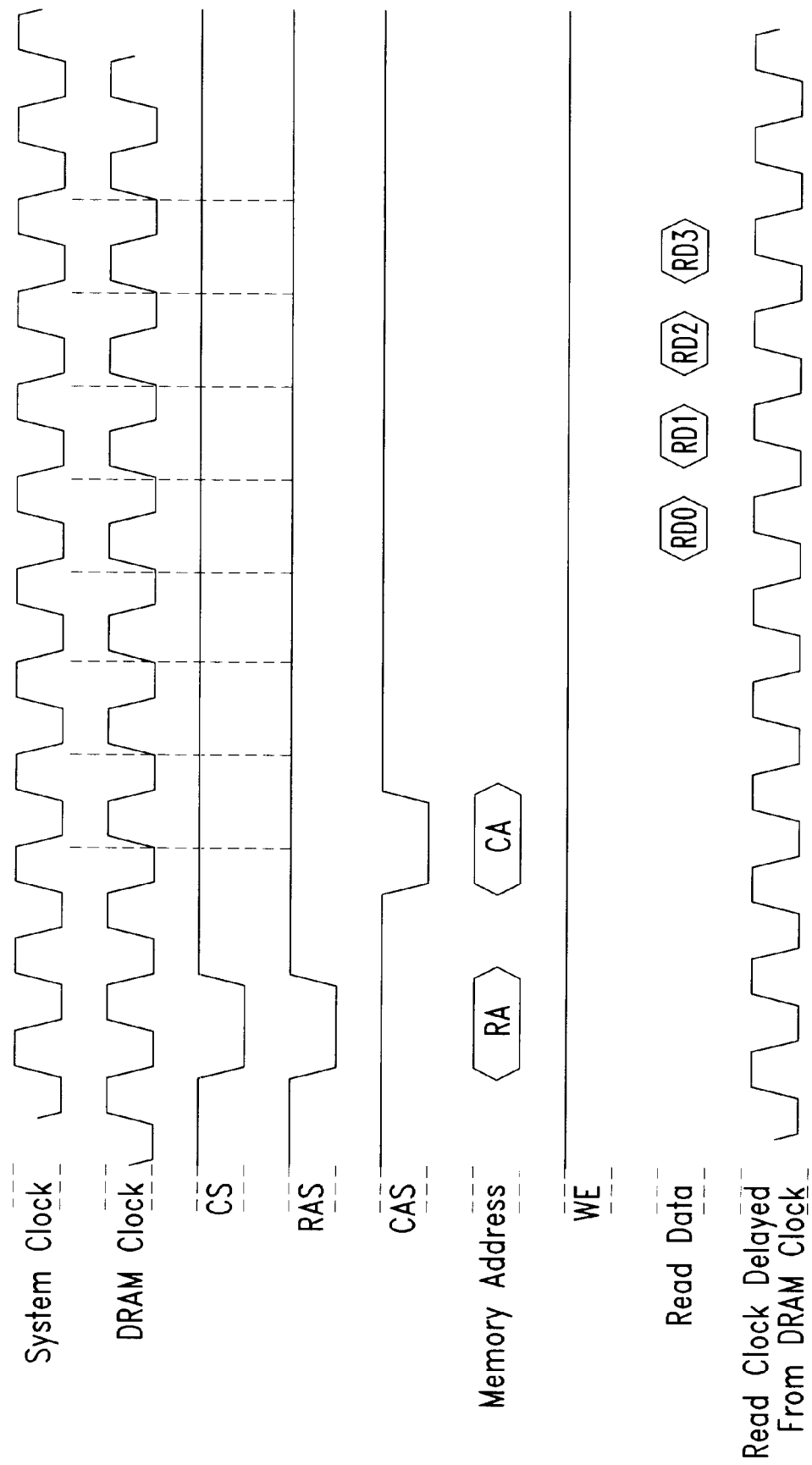
FIG. 7 is a timing diagram of a read operation performed by the memory interface and SDRAM of FIG. 6.

The timing diagram of FIG. 7 shows an exemplary read operation for an SDRAM in the embodiment of the present invention illustrated in FIGS. 6A through 6C. The timing diagram of FIG. 7 is generally self-explanatory to those skilled in the relevant art, as is the operation of SDRAM. One noteworthy point is that the inverted system clock signal is delayed as shown in FIG. 7, so that the data is read from the latches 130 and 132 in synchronism with a delayed inverted system clock signal.

SDRAM Write Circuit

Figure 8:
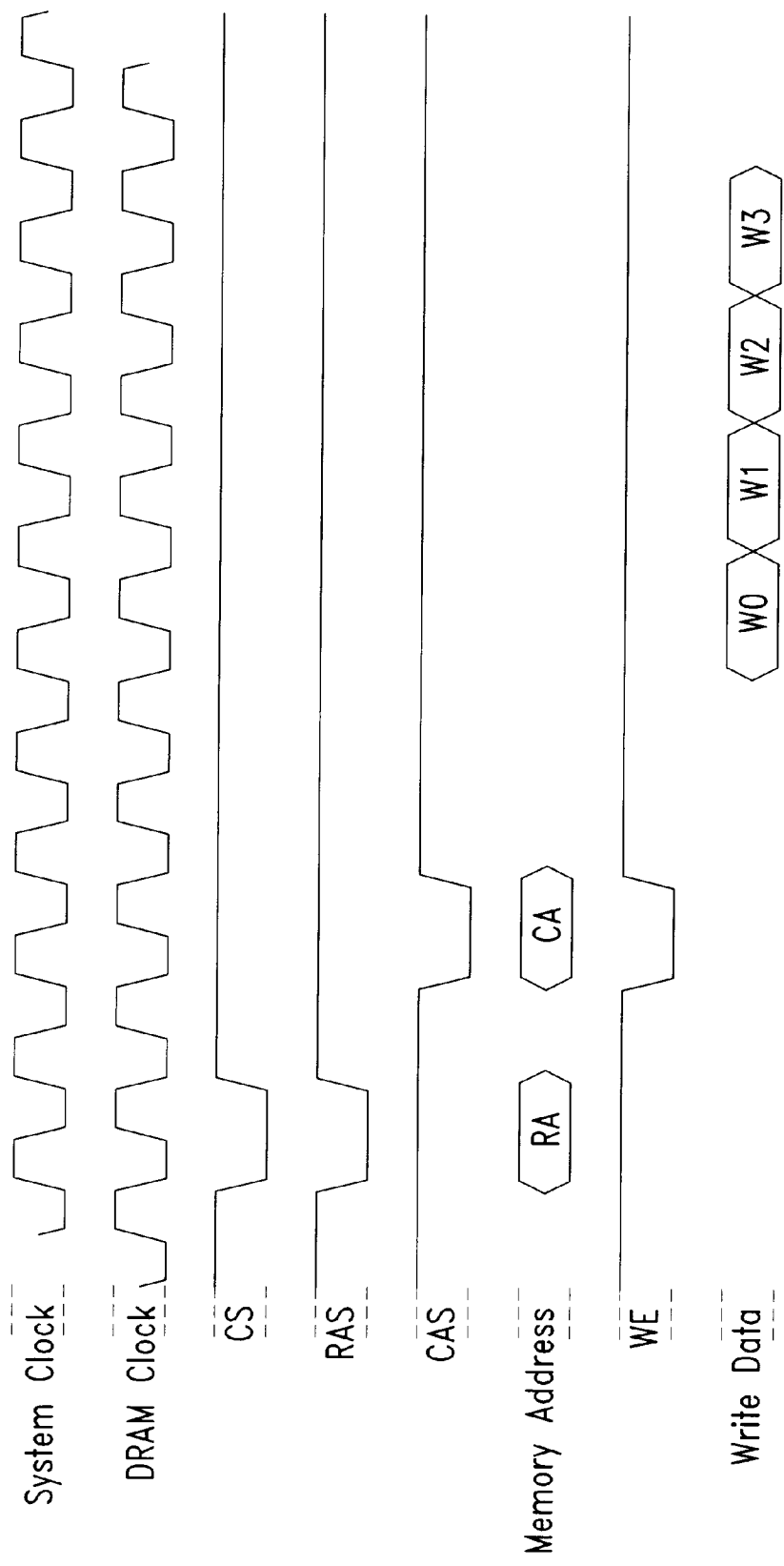
FIG. 8 is a timing diagram of a write operation performed by the memory interface and SDRAM of FIG. 6.

Referring back to FIG. 6C, the inverted system clock signal from the inverter 160 provides a one-half cycle lag between the system clock signal and operation of the SDRAM memory under the interface circuit 119". As a result, the inverted clock signal will be substantially aligned with a center of the data written from the write register 150 to the synchronous DRAM memory, as shown in the timing diagram of FIG. 8. The write data provided to the write register 150 may travel a substantially equal distance to the synchronous DRAM memory as the system clock signal to provide a form of "source clocking." Again, the timing diagram of FIG. 8, which shows an exemplary write operation, is generally self-explanatory to those skilled in the relevant art. One noteworthy point is that the data is clocked out of the write register in synchronism with the System Clock signal, but is not written to the SDRAM until approximately one-half clock cycle later, as a result of the inverted system clock signal (DRAM Clock signal).

Although specific embodiments of, and examples for, the present invention are described herein for illustrative purposes, various equivalent modifications can be made without departing from the spirit and scope of the invention, as will be recognized by those skilled in the relevant art. The teachings provided herein of the present invention can be applied to other memory devices, not necessarily the exemplary BEDO DRAM and synchronous DRAM memory described above.

These and other changes can be made to the invention in light of the above detailed description. In general, in the following claims, the terms used should not be construed to limit the invention to the specific embodiments disclosed in the specification, but should be construed to include any memory interface circuit that operates under the claims. Accordingly, the invention is not limited by the disclosure, but instead its scope is to be determined entirely by the following claims.

I claim:

1. In a computer system having a CPU and a memory device, a method of transferring data between the CPU and the memory device, comprising:

receiving a system clock signal;

producing an interface clocking signal that is provided to the memory device in response to the system clock signal;

receiving and storing alternately in at least two storage devices consecutive groups of data read from the memory device in response to portions of the interface clocking signal;

outputting the stored read data as consecutive groups of data to the CPU in response to the system clock signal;

receiving and storing consecutive groups of write data from the CPU;

providing the consecutive groups of write data to the memory device in response to the system clock signal; and writing the write data to the memory device based on the interface clocking signal and wherein the memory device is a burst extended data out memory device, and wherein the method further includes:

determining a delay in providing write data from the CPU to the memory device; and selectively providing portions of the system clock signal as the interface clocking signal based on the determined delay.

2. The method of claim 1 wherein receiving and storing includes multiplexing the groups of read data.

3. In a computer system having a CPU and a memory device, a method of transferring data between the CPU and the memory device, comprising:

receiving a system clock signal;

producing in interface clocking signal that is provided to the memory device in response to the system clock signal;

receiving and storing alternately in at least two storage devices consecutive groups of data read from the memory device in response to portions of the interface clocking signal;

outputting the stored read data as consecutive groups of data to the CPU in response to the system clock signal;

receiving and storing consecutive groups of write data from the CPU;

providing the consecutive groups of write data to the memory device in response to the system clock signal; and writing the write data to the memory device based on the interface clocking signal and wherein the memory device is a synchronous semiconductor memory device, and wherein producing an interface clocking signal includes:

inverting the system clock signal; and providing the inverted clock signal as the interface clocking signal to the synchronous memory device.

4. In a computer system having a CPU and a memory device, a method of transferring data between the CPU and the memory device, comprising:

receiving a system clock signal;

producing an interface clocking signal that is provided to the memory device in response to the system clock signal;

receiving and storing alternately in at least two storage devices consecutive groups of data read from the memory device in response to portions of the interface clocking signal;

outputting the stored read data as consecutive groups of data to the CPU in response to the system clock signal;

receiving and storing consecutive groups of write data from the CPU;

providing the consecutive groups of write data to the memory device in response to the system clock signal; and writing the write data to the memory device based on the interface clocking signal and wherein the memory device is a synchronous semiconductor memory device, and wherein receiving and storing includes:

producing a delayed interface clocking signal; and receiving the groups of read data based on the delayed interface clocking signal.

5. A method of transferring data between a memory controller circuit and a memory device, comprising:

producing an interface clocking signal based on a system clock signal;

controlling operation of the memory device based on the interface clocking signal;

alternately storing in at least two storage devices consecutive groups of data read from the memory device in response to the interface clocking signal;

outputting the stored read data as consecutive groups of data to the memory controller circuit in response to the system clock signal;

storing consecutive groups of write data from the memory controller circuit; and providing the consecutive groups of write data to the memory device in response to the system clock signal and wherein the memory device is a burst extended data out memory device, and wherein the method further includes:

determining a delay in providing the write data from the memory controller to the memory device; and selectively providing portions of the system clock signal as the interface clocking signal based on the determined delay.

6. The method of claim 5 wherein storing includes multiplexing the groups of read data.

7. A method of transferring data between a memory controller circuit and a memory device, comprising:

producing an interface clocking signal based on a system clock signal;

controlling operating of the memory device based on the interface clocking signal;

alternately storing in at least two storage devices consecutive groups of data read from the memory device in response to the interface clocking signal;

outputting the stored read data as consecutive groups of data to the memory controller circuit in response to the system clock signal;

storing consecutive groups of write data from the memory controller circuit; and providing the consecutive groups of write data to the memory device in response to the system clock signal and wherein the memory device is a synchronous semiconductor memory device, and wherein producing an interface clocking signal includes inverting the system clock signal, and providing the inverted clock signal as the interface clocking signal to the synchronous memory device.

8. A method of transferring data between a memory controller circuit and a memory device, comprising:

producing an interface clocking signal based on a system clock signal;

controlling operation of the memory device based on the interface clocking signal;

alternately storing in at least two storage devices consecutive groups of data read from the memory device in response to the interface clocking signal;

outputting the stored read data as consecutive groups of data to the memory controller circuit in response to the system clock signal;

storing consecutive groups of write data from the memory controller circuit; and providing the consecutive groups of write data to the memory device in response to the system clock signal and wherein the memory device is a synchronous semiconductor memory device, and wherein storing includes:

producing a delayed interface clocking signal; and receiving the groups of read data based on the delayed interface clocking signal.

9. In a computer system having a CPU and a memory device, a method of transferring data between the CPU and the memory device, comprising:

receiving a system clock signal;

producing an interface clocking signal that is provided to the memory device in response to the system clock signal;

storing a first set of data, in response to the interface clocking signal;

storing a second set of data, in response to the interface clocking signal;

outputting the first set of data while storing the second set of data, in response to the interface clocking signal;

outputting the second set of data, in response to the interface clocking signal;

storing a third set of data, in response to the interface clocking signal;

storing a fourth set of data, in response to the interface clocking signal;

writing the third set of data to the memory device while performing the step of storing the fourth set of data, in response to the interface clocking signal; and writing the fourth set of data to the memory device, in response to the interface clocking signal, and wherein the memory device is a burst extended data out memory device, and wherein the method further includes:

determining a delay in providing the write data from the CPU to the memory device; and selectively providing portions of the system clock signal as the interface clocking signal based on the determined delay.

10. In a computer system having a CPU and a memory device, a method of transferring data between the CPU and the memory device, comprising:

receiving a system clock signal;

producing an interface clocking signal that is provided to the memory device in response to the system clock signal;

storing a first set of data, in response to the interface clocking signal;

storing a second set of data, in response to the interface clocking signal;

outputting the first set of data while storing the second set of data, in response to the interface clocking signal;

outputting the second set of data, in response to the interface clocking signal;

storing a third set of data, in response to the interface clocking signal;

storing a fourth set of data, in response to the interface clocking signal;

writing the third set of data to the memory device while performing the step of storing the fourth set of data, in response to the interface clocking signal; and writing the fourth set of data to the memory device, in response to the interface clocking signal and wherein the memory device is a synchronous semiconductor memory device, and wherein producing an interface clocking signal includes:

inverting the system clock signal; and providing the inverted clock signal as the interface clocking signal to the synchronous memory device.

11. In a computer system having a CPU and a memory device, a method of transferring data between the CPU and the memory device, comprising:

receiving a system clock signal;

producing an interface clocking signal that is provided to the memory device in response to the system clock signal;

storing a first set of data, in response to the interface clocking signal;

storing second set of data, in response to the interface clocking signal;

outputting the first set of data while storing the second set of data, in response to the interface clocking signal;

outputting the second set of data, in response to the interface clocking signal;

storing a third set of data, in response to the interface clocking signal;

storing a fourth set of data in response to the interface clocking signal;

writing the third set of data to the memory device while performing the step of storing the fourth set of data, in response to the interface clocking signal; and writing the fourth set of data to the memory device, in response to the interface clock signal and wherein the memory device is a synchronous semiconductor memory device, and wherein storing includes:

producing a delayed interface clocking signal; and receiving the first and second sets of read data based on the delayed interface clocking signal.

12. A method for exchanging data with a semiconductor memory device, the memory controller comprising:

receiving write data;

receiving a clock signal and producing a timing signal for the memory device;

writing and multiplexing the write data to the memory device, wherein the write data is written to the memory device based on the timing signal;

reading and multiplexing read data from the memory device in response to portions or the timing signal; and outputting the read data to the control circuit and wherein the memory device is a burst extended data out semiconductor memory device, and wherein the method further comprises:

receiving and inverting a $\overline{CAS}$ signal; and providing a delayed signal as the timing signal.

13. A method for exchanging data with a semiconductor memory device, the memory controller comprising:

receiving write data;

receiving a clock signal and producing a timing signal for the memory device;

writing and multiplexing the write data to the memory device, wherein the write data is written to the memory device based on the timing signal;

reading and multiplexing read data from the memory device in response to portions of the timing signal; and outputting the read data to the control circuit and wherein the memory device is a burst extended data out semiconductor memory device, wherein the clock signal is a system clock signal, and wherein the method further comprises:

receiving the system clock signal and producing a heavily loaded $\overline{CAS}$ signal from positive edges of the system clock signal;

receiving the system clock signal and producing a lightly loaded $\overline{CAS}$ signal from negative edges of the system clock signal; and selectively providing one of the heavily and lightly loaded $\overline{CAS}$ signals to the memory device as a $\overline{CAS}$ signal based on a delay in providing write data to the memory device.

14. A method for exchanging data with a semiconductor memory device, the memory controller comprising:

receiving write data;

receiving a clock signal and producing a timing signal for the memory device;

writing and multiplexing the write data to the memory device, wherein the write data is written to the memory device based on the timing signal;

reading and multiplexing read data from the memory device in response to portions of the timing signal; and outputting the read data to the control circuit and wherein the memory device is a burst extended data out semiconductor memory device, and wherein the method further comprises:

latching the read data; and registering the latched read data in response to the clock signal, the clock signal being a system clock signal.

15. A method for exchanging data with a semiconductor memory device, the memory controller comprising:

receiving write data;

receiving a clock signal and producing a timing signal for the memory device;

writing and multiplexing the write data to the memory device, wherein the write data is written to the memory device based on the timing signal;

reading and multiplexing read data from the memory device in response to portions of the timing signal; and outputting the read data to the control circuit and wherein the memory device is a synchronous semiconductor memory device, wherein the clock signal is a system clock signal, and wherein the method further comprises inverting the clock signal and producing an inverted clock signal as the timing signal to the synchronous memory device.

16. A method for exchanging data with a semiconductor memory device, the memory controller comprising:

receiving write data;

receiving a clock signal and producing a timing signal for the memory device;

writing and multiplexing the write data to the memory device, wherein the write data is written to the memory device based on the timing signal;

reading and multiplexing read data from the memory device in response to portions of the timing signals; and outputting the read data to the control circuit and wherein the memory device is a synchronous semiconductor memory device, and wherein the method further comprises:

delaying the clock signal as the timing signal; and registering and outputting the read data in synchronism with the clock signal, the clock signal being a system clock signal.

17. In a computer system having a CPU and a memory device, a method of transferring data between the CPU and the memory device, comprising:

receiving a system clock signal;

producing an interface clocking signal that is provided to the memory device in response to the system clock signal, including inverting the system clock signal and providing the inverted clock signal as the interface clocking signal to the memory device;

receiving and storing alternately in at least two storage devices consecutive groups of data read from the memory device in response to portions of the interface clocking signal; and outputting the stored read data as consecutive groups of data to the CPU in response to the system clock signal and, further comprising:

receiving and storing consecutive groups of write data from the CPU;

providing the consecutive groups of write data to the memory device in response to the system clock signal; and writing the write data to the memory device based on the interface clocking signal.

18. In a computer system having a CPU and a memory device a method of transferring data between the CPU and the memory device, comprising:

receiving a system clock signal;

producing an interface clocking signal that is provided to the memory device in response to the system clock signal, including inverting the system clock signal and providing the inverted clock signal as the interface clocking signal to the memory device;

receiving and storing alternately in at least two storage devices consecutive groups of data read from the memory device in response to portions of the interface clocking signal; and outputting the stored read data as consecutive groups of data to the CPU in response to the system clock signal and wherein the memory device is a burst extended data out memory device, and wherein the method further includes:

determining a delay in providing the write data from the CPU to the memory device; and selectively providing portions of the system clock signal as the interface clocking signal based on the determined delay.

19. In a computer system having a CPU and a memory device, a method of transferring data between the CPU and the memory device, comprising:

receiving a system clock signal;

producing an interface clocking signal that is provided to the memory device in response to the system clock signal, including inverting the system clock signal and providing the inverted clock signal as the interface clocking signal to the memory device;

receiving and storing alternately in at least two storage devices consecutive groups of data read from the memory device in response to portions of the interface clocking signal; and outputting the stored read data as consecutive, groups of data to the CPU in response to the system clock signal and wherein the memory device is a synchronous semiconductor memory device, and wherein receiving and storing includes:

producing a delayed interface clocking signal; and receiving the groups of read data based on the delayed interface clocking signal.

20. A method of transferring data between a memory controller circuit and a memory device, comprising:

producing an interface clocking signal based on a system clock signal, including inverting the system clock signal and providing the inverted clock signal as the interface clocking signal to the memory device;

controlling operation of the memory device based on the interface clocking signal;

alternately storing in at least two storage devices consecutive groups of data read from the memory device in response to the interface clocking signal;

outputting the stored read data as consecutive groups of data to the memory controller circuit in response to the system clock signal and, further comprising:

storing consecutive groups of write data from the memory controller circuit; and providing the consecutive groups of write data to the memory device in response to the system clock signal.

21. A method of transferring data between a memory controller circuit and a memory device, comprising:

producing an interface clocking signal based on a system clock signal, including inverting the system clock signal and providing the inverted clock signal as the interface clocking signal to the memory device;

controlling operation of the memory device based on the interface clocking signal;

alternately storing in at least two storage devices consecutive groups of data read from the memory device in response to the interface clocking signal;

outputting the stored read data as consecutive groups of data to the memory controller circuit in response to the system clock signal and wherein the memory device is a burst extended data out memory device, and wherein the method further includes:

determining a delay in providing the write data from the memory controller to the memory device; and selectively providing portions of the system clock signal as the interface clocking signal based on the determined delay.

22. A method of transferring data between a memory controller circuit and a memory device, comprising:

producing an interface clocking signal based on a system clock signal, including inverting the system clock signal and providing the inverted clock signal as the interface clocking signal to the memory device;

controlling operation of the memory device based on the interface clocking signal;

alternately storing in at least two storage devices consecutive groups of data read from the memory device in response to the interface clocking signal;

outputting the stored read data as consecutive groups of data to the memory controller circuit in response to the system clock signal and wherein the memory device is a synchronous semiconductor memory device and wherein storing includes:

producing a delayed interface clocking signal; and receiving the groups of read data based on the delayed interface clocking signal.

23. In a computer system having a CPU and a memory device, a method of transferring data between the CPU and the memory device, comprising:

receiving a system clock signal;

producing an interface clocking signal that is provided to the memory device in response to the system clock signal, including inverting the system clock signal and providing the inverted clock signal as the interface clocking signal to the memory device;

storing a first set of data, in response to the interface clocking signal;

storing a second set of data, in response to the interface clocking signal;

outputting a first set of data while storing the second set of data, in response to the interface clocking signal; and outputting a second set of data, in response to the interface clocking signal and, further comprising:

storing a third set of data, in response to the interface clocking signal;

storing a fourth set of data, in response to the interface clocking signal;

writing the third set of data to the memory device while performing the step of storing the fourth set of data, in response to the interface clocking signal; and writing the fourth set of data to the memory device, in response to the interface clocking signal.

24. In a computer system having a CPU and a memory device, a method of transferring data between the CPU and the memory device, comprising:

receiving a system clock signal;

producing an interface clocking signal that is providing to the memory device in response to the system clock signal, including inverting the system clock signal and providing the inverted clock signal as the interface clocking signal to the memory device;

storing a first set of data, in response to the interface clocking signal;

storing a second set of data, in response to the interface clocking signal;

outputting a first set of data while storing the second set of data, in response to the interface clocking signal; and outputting a second set of data, in response to the interface clocking signal and wherein the memory device is a burst extended data out memory device, and wherein the method further includes:

determining a delay in providing the write data from the CPU to the memory device; and selectively providing portions of the system clock signal as the interface clocking signal based on the determined delay.

25. In a computer system having a CPU and a memory device, a method of transferring data between the CPU and the memory device, comprising:

receiving a system clock signal;

producing an interface clocking signal that is provided to the memory device in response to the system clock signal, including inverting the system clock signal and providing the inverted clock signal as the interface clocking signal to the memory device;

storing a first set of data, in response to the interface clocking signal;

storing a second set or data, in response to the interface clocking signal;

outputting a first set of data while storing the second set of data, in response to the interface clocking signal; and outputting a second set of data, in response to the interface clocking signal and wherein the memory device is a synchronous semiconductor memory device, and wherein storing includes:

producing a delayed interface clocking signal; and receiving the first and second sets of read data based on the delayed interface clocking signal.

* * * * *

UNITED STATES PATENT AND TRADEMARK OFFICE
CERTIFICATE OF CORRECTION

PATENT NO.    : 5,909,701
DATED         : June 1, 1999
INVENTOR(S)   : Joe M. Jeddeloh It is certified that error appears in the above-identified patent and that said Letters Patent is hereby corrected as shown below:

Column 2,
Line 11, "RAM" should read -- DRAM --

Column 4,
Line 61, "rite" should read -- write --

Signed and Sealed this

Eighteenth Day of September, 2001

*Attest:*

*Attesting Officer*

NICHOLAS P. GODICI
*Acting Director of the United States Patent and Trademark Office*